US012593638B2

(12) United States Patent
Yamamoto et al.

(10) Patent No.: US 12,593,638 B2
(45) Date of Patent: Mar. 31, 2026

(54) DEVICE WAFER PROCESSING METHOD

(71) Applicant: DISCO CORPORATION, Tokyo (JP)

(72) Inventors: Naoko Yamamoto, Tokyo (JP);
Shunsuke Teranishi, Tokyo (JP)

(73) Assignee: DISCO CORPORATION, Tokyo (JP)

( * ) Notice: Subject to any disclaimer, the term of this
patent is extended or adjusted under 35
U.S.C. 154(b) by 379 days.

(21) Appl. No.: 18/341,085

(22) Filed: Jun. 26, 2023

(65) Prior Publication Data

US 2024/0006239 A1 Jan. 4, 2024

(30) Foreign Application Priority Data

Jun. 30, 2022 (JP) ................................. 2022-105915

(51) Int. Cl.
*H01L 21/78* (2006.01)
*H01L 21/02* (2006.01)
(Continued)

(52) U.S. Cl.
CPC ........ *H01L 21/78* (2013.01); *H01L 21/02076*
(2013.01); *H01L 21/268* (2013.01); *H01L*
*21/6836* (2013.01); *H01L 23/544* (2013.01);
*H01L 2221/68327* (2013.01); *H01L*
*2221/68386* (2013.01); *H01L 2223/5446*
(2013.01)

(58) Field of Classification Search
CPC . H01L 21/78; H01L 21/02076; H01L 21/268;
H01L 21/6836; H01L 23/544; H01L
2221/68327; H01L 2221/68386; H01L
2223/5446; H01L 21/304; H01L 21/3043;
H01L 21/6835; H01L 2221/6834;
(Continued)

(56) References Cited

U.S. PATENT DOCUMENTS 7,008,861 B2 * 3/2006 Andrews ................. H01L 21/78
257/E21.599
7,642,113 B2 * 1/2010 Kurosawa .......... B23K 26/3568
438/458
(Continued)

FOREIGN PATENT DOCUMENTS

JP 2006093285 A 4/2006
JP 2015126054 A 7/2015
JP 2020031135 A 2/2020

OTHER PUBLICATIONS

Japanese Patent Application No. 2022-105915: English translation
of Office Action, Jan. 6, 2026 (4 pages).

*Primary Examiner* — Vu A Vu
(74) *Attorney, Agent, or Firm* — Greer, Burns & Crain,
Ltd.

(57) ABSTRACT

A device wafer processing method includes a protective film
coating step of coating a face side of a device wafer with a
protective film, a laser processing step of applying a laser
beam having a wavelength absorbable by the device wafer
to the device wafer along streets and forming laser process-
ing grooves that divide a device layer, a tape affixing step of
affixing a tape to the protective film on the device wafer, a
holding step of holding the face side of the device wafer by
a holding table via the tape and exposing a reverse side of
the device wafer, and a cutting step of cutting the device
wafer held on the holding table, by a cutting blade from the
reverse side along the streets, and dividing the device wafer
into individual devices.

4 Claims, 11 Drawing Sheets

(51) Int. Cl.

| | | |
|---|---|---|
| *H01L 21/268* | (2006.01) | |
| *H01L 21/683* | (2006.01) | |
| *H01L 23/544* | (2006.01) | |

(58) Field of Classification Search
     CPC .... B23K 26/36; B23K 26/702; B23K 26/364;
                                              B28D 5/00
     USPC ........................................................ 438/462
     See application file for complete search history.

(56) References Cited

U.S. PATENT DOCUMENTS

| | | | | |
|---|---|---|---|---|
| 8,293,584 | B2 * | 10/2012 | Guillermo | H01L 24/05 |
| | | | | 438/114 |
| 8,852,971 | B2 * | 10/2014 | Kim | H10H 20/01 |
| | | | | 438/33 |
| 10,177,111 | B2 * | 1/2019 | Kamphuis | H01L 24/11 |
| 10,366,925 | B2 * | 7/2019 | Sugiya | H01L 21/304 |
| 10,840,140 | B2 * | 11/2020 | Obata | H01L 21/268 |
| 11,011,406 | B2 * | 5/2021 | Priewasser | H01L 21/6836 |
| 2015/0187650 | A1 | 7/2015 | Uchida et al. | |
| 2017/0076982 | A1 * | 3/2017 | Sakakura | H01L 21/6836 |

* cited by examiner

FIG.13

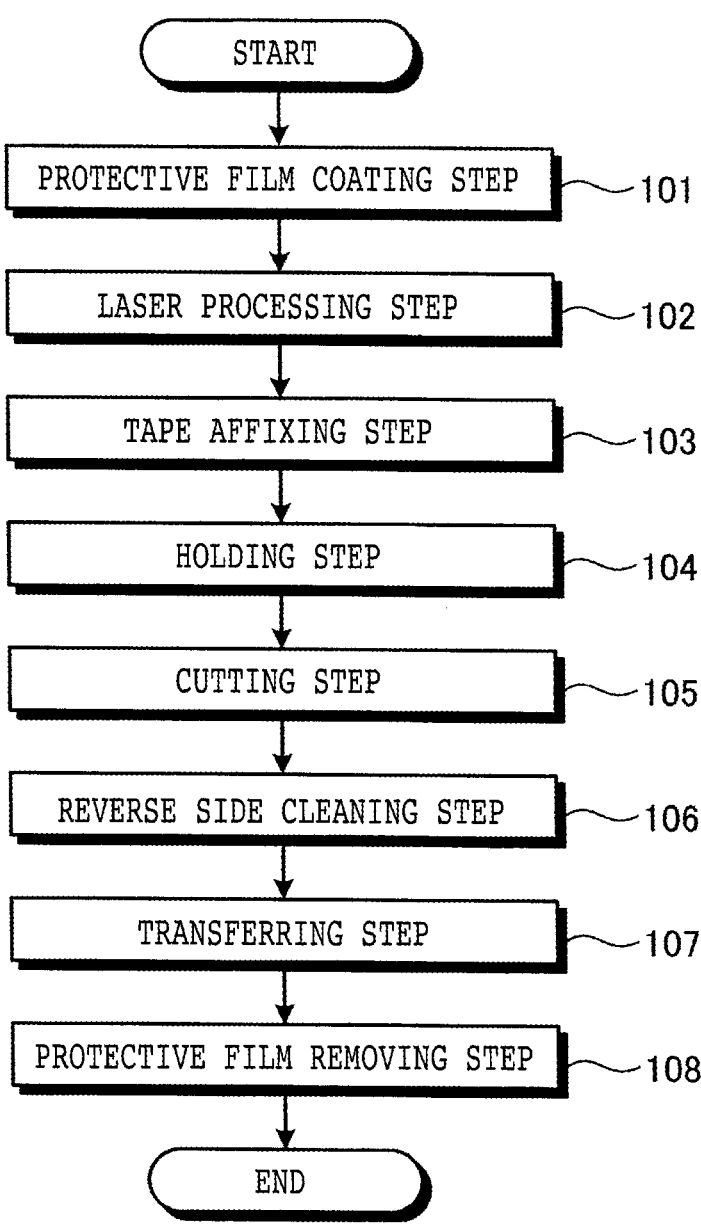

```
              ┌─────────────┐
              │    START     │
              └─────────────┘
                     │
                     ▼
   ┌──────────────────────────────────┐
   │  PROTECTIVE FILM COATING STEP    │──── 101
   └──────────────────────────────────┘
                     │
                     ▼
   ┌──────────────────────────────────┐
   │      LASER PROCESSING STEP       │──── 102
   └──────────────────────────────────┘
                     │
                     ▼
   ┌──────────────────────────────────┐
   │        TAPE AFFIXING STEP        │──── 103
   └──────────────────────────────────┘
                     │
                     ▼
   ┌──────────────────────────────────┐
   │          HOLDING STEP            │──── 104
   └──────────────────────────────────┘
                     │
                     ▼
   ┌──────────────────────────────────┐
   │          CUTTING STEP            │──── 105
   └──────────────────────────────────┘
                     │
                     ▼
   ┌──────────────────────────────────┐
   │    REVERSE SIDE CLEANING STEP    │──── 106
   └──────────────────────────────────┘
                     │
                     ▼
   ┌──────────────────────────────────┐
   │        TRANSFERRING STEP         │──── 107
   └──────────────────────────────────┘
                     │
                     ▼
   ┌──────────────────────────────────┐
   │  PROTECTIVE FILM REMOVING STEP   │──── 108
   └──────────────────────────────────┘
                     │
                     ▼
              ┌─────────────┐
              │     END      │
              └─────────────┘
```

DEVICE WAFER PROCESSING METHOD

BACKGROUND OF THE INVENTION

Field of the Invention

The present invention relates to a device wafer processing method.

Description of the Related Art

In recent years, in association with higher integration of devices, hybrid bonding, which is a method of connecting electrodes formed on face sides of device wafers to each other, has come into use. In hybrid bonding, since the face sides of the device wafers are bonded to each other, adherence of foreign matter to the face side of the wafer could cause bonding failures. Hence, in hybrid bonding, there is a demand for reduced adherence of foreign matter to the face side of the diced device wafer, compared with conventional bonding performed with bumps.

Foreign matter that adheres to the diced device wafer is mainly dicing swarf generated by dicing of device wafers and tapes, and swarf that has been left unremoved in the subsequent cleaning process causes a problem at the time of bonding. Hence, affixing a tape to the face side of the device wafer and processing the device wafer from the reverse side are expected to reduce adherence of foreign matter to the face side of the device wafer (see, for example, Japanese Patent Laid-open No. 2006-93285).

SUMMARY OF THE INVENTION

Yet, cutting, by a cutting blade, a wafer which has a face side to which a tape is affixed and dividing it into individual devices cause the problem of large chipping and cracking on the face side of the wafer supported by the tape.

It is accordingly an object of the present invention to provide a processing method that is capable of reducing adherence of foreign matter to the face side of the wafer without deteriorating the processing quality on the face side.

In accordance with an aspect of the present invention, there is provided a device wafer processing method that divides a device wafer having devices formed on a face side thereof by a device layer laminated on a wafer, along a plurality of streets that demarcate the devices, the processing method including a protective film coating step of coating the face side of the device wafer with a protective film, a laser processing step of applying, along the streets, a laser beam having a wavelength absorbable by the device wafer to the device wafer and forming laser processing grooves that divide the device layer, after the protective film coating step is carried out, a tape affixing step of affixing a tape to the protective film on the device wafer, after the laser processing step is carried out, a holding step of holding the face side of the device wafer by a holding table via the tape and exposing a reverse side of the device wafer, after the tape affixing step is carried out, and a cutting step of cutting the device wafer held on the holding table, by a cutting blade from the reverse side along the streets, and dividing the device wafer into individual devices, after the holding step is carried out.

The device wafer processing method may further include a reverse side cleaning step of cleaning the reverse side of the device wafer, after the cutting step is carried out, a transferring step of affixing a reverse side tape to the cleaned reverse side and peeling off the tape from the face side of the device wafer, after the reverse side cleaning step is carried out, and a protective film removing step of removing the protective film on the face side of the device wafer, after the transferring step is carried out.

The protective film may be composed of water-soluble resin, and, in the protective film removing step, cleaning water may be supplied to the face side of the device wafer to remove the protective film and clean the face side.

According to the aspect of the present invention, adherence of foreign matter to the face side of the device wafer can be reduced without deteriorating the processing quality on the face side.

The above and other objects, features and advantages of the present invention and the manner of realizing them will become more apparent, and the invention itself will best be understood from a study of the following description and appended claims with reference to the attached drawings showing preferred embodiments of the invention.

BRIEF DESCRIPTION OF THE DRAWINGS

FIG. 13 is a flowchart illustrating a flow of the processing method according to a second embodiment of the present invention;

DETAILED DESCRIPTION OF THE PREFERRED EMBODIMENTS

Embodiments of the present invention will be described in detail below with reference to the attached drawings. The present invention is not limited by the contents described in the following embodiments. Moreover, the constituent elements described below include those that can easily be arrived at by a person skilled in the art and those that are substantially the same. Further, the configurations described below can be combined as appropriate. Furthermore, various omissions, replacements, or modifications can be made within the scope not departing from the gist of the present invention.

First Embodiment

Figure 1:
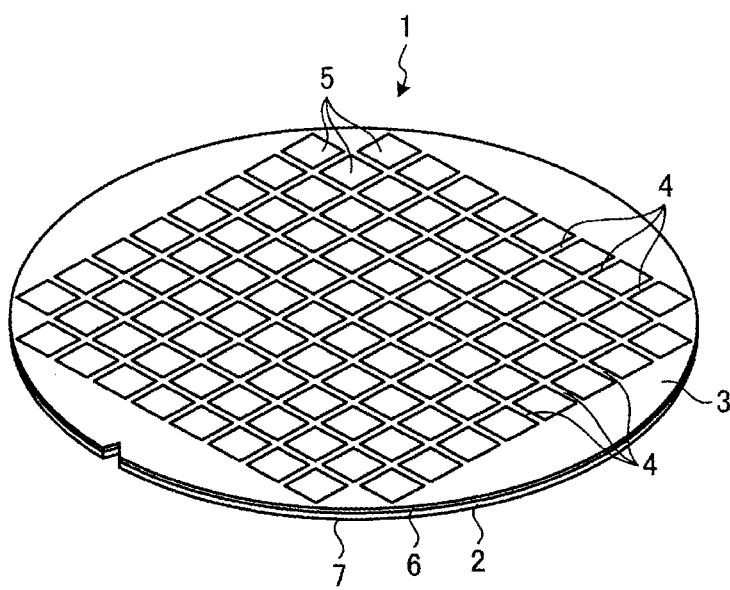
FIG. 1 is a perspective view schematically illustrating a device wafer that is to be processed by a processing method according to a first embodiment of the present invention.
Figure 2:
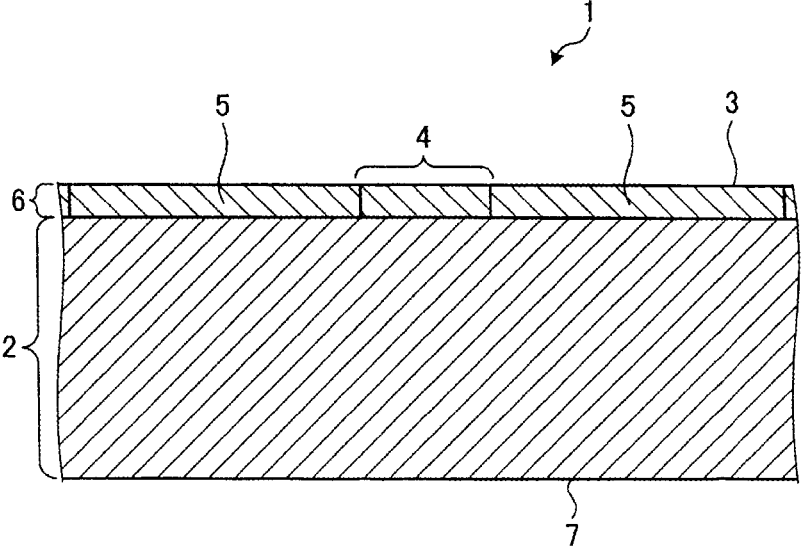
FIG. 2 is a cross sectional view of main parts of the device wafer illustrated in FIG. 1.
Figure 3:
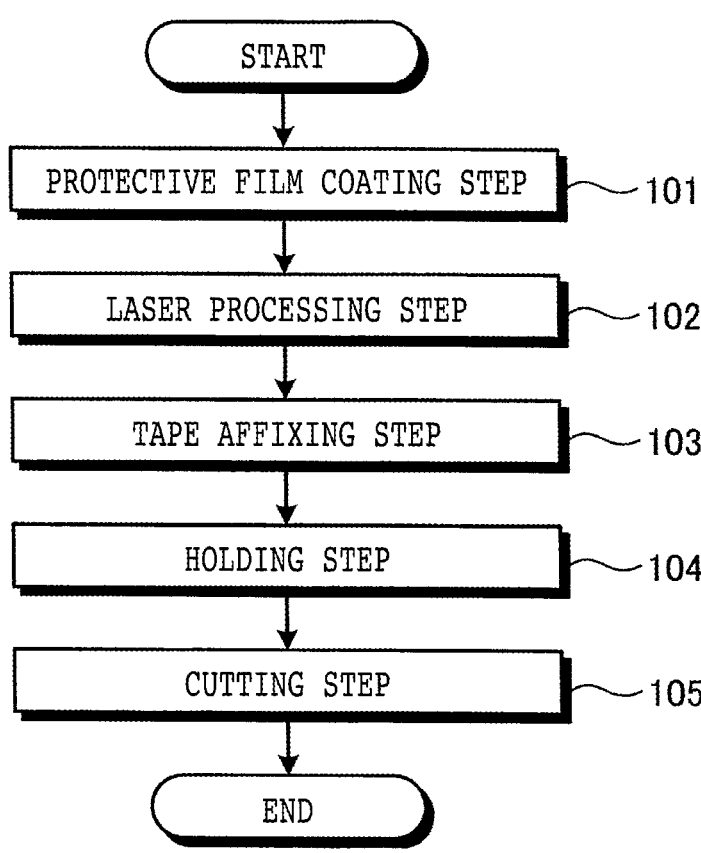
FIG. 3 is a flowchart illustrating a flow of the processing method according to the first embodiment.

A device wafer processing method according to a first embodiment of the present invention will be described in reference to the drawings. FIG. 1 is a perspective view schematically illustrating a device wafer that is to be processed by the processing method according to the first embodiment. FIG. 2 is a cross sectional view of main parts of the device wafer illustrated in FIG. 1. FIG. 3 is a flowchart illustrating a flow of the processing method according to the first embodiment.

Device Wafer

The processing method according to the first embodiment is a processing method for the device wafer denoted by 1 and illustrated in FIG. 1. In the first embodiment, the device wafer 1 is such a wafer as a circular plate-shaped semiconductor wafer that has a substrate 2 composed of silicon, sapphire, gallium arsenide, silicon carbide (SiC) or the like. As illustrated in FIG. 1, the device wafer 1 has a plurality of devices 5 formed in respective areas demarcated in a grid pattern by a grid of streets 4 on a face side 3.

The device 5 is, for example, an integrated circuit (IC), such as a large scale integration (LSI) circuit, or a memory (semiconductor storage device). Further, the device 5 has unillustrated electrodes on its face side. Each of the electrodes is flat, and is preferably positioned to be flush with the face side of the device 5 in the first embodiment. The electrode is composed of conductive metal such as copper alloy and is used to connect the device 5 of the device wafer 1 with a device of another wafer or a device of a device chip, for example.

Specifically, in the first embodiment, the device wafer 1 is a wafer in which a device of another wafer or a device of a device chip is superposed on the device 5 and the electrodes of the device 5 are bonded to the electrodes of the device of the other wafer or the device of the relevant device chip. As described above, in the first embodiment, the device wafer 1 that is to be processed by the processing method is a wafer that is obtained by what is generally called hybrid bonding, but the wafer to which the present invention is applicable is not limited to a wafer that is to be obtained by hybrid bonding.

In the first embodiment, the device wafer 1 has, as illustrated in FIGS. 1 and 2, a device layer 6 laminated on the substrate 2. The device layer 6 includes a low dielectric constant insulation film (hereinafter referred to as a low-k film) including an inorganic film such as fluorine-doped silicon oxide (SiOF) or borosilicate glass (BSG) (silicon optical bench: SiOB), an organic film such as a polyimide-based or parylene-based polymer film, or a carbon-doped silicon oxide (SiOCH) film and a circuit layer including conductive metal patterns or metal films.

The low-k films are laminated on the circuit layer, forming the device 5. The circuit layer configures the circuit of the device 5. That is, the device 5 includes the low-k films that are laminated one on top of the other in the device layer 6 laminated on the substrate 2 and the circuit layer disposed between the low-k films. In the streets 4, the device layer 6 is composed of the low-k films laminated on the substrate 2, except a test elementary group (TEG).

In the first embodiment, the device wafer 1 includes unillustrated TEGs in the streets 4. TEGs are evaluation elements for finding design or manufacturing problems that occur in the devices 5. The device layer 6 as exemplified by low-k films and TEGs are easily peeled off from the substrate 2 when the device wafer 1 is cut by a cutting blade from the face side 3. As described above, in the first embodiment, the device wafer 1 has the devices 5 formed on the face side 3 by the device layer 6 laminated on the substrate 2.

Processing Method

The device wafer processing method according to the first embodiment is a method of dividing the device wafer 1 into individual devices 5 along the streets 4 that demarcate the devices 5, the device wafer 1 having the devices 5 formed on the face side 3 by the device layer 6 laminated on the substrate 2 as described above. As illustrated in FIG. 3, the processing method includes a protective film coating step 101, a laser processing step 102, a tape affixing step 103, a holding step 104, and a cutting step 105.

Protective Film Coating Step

Figure 4:
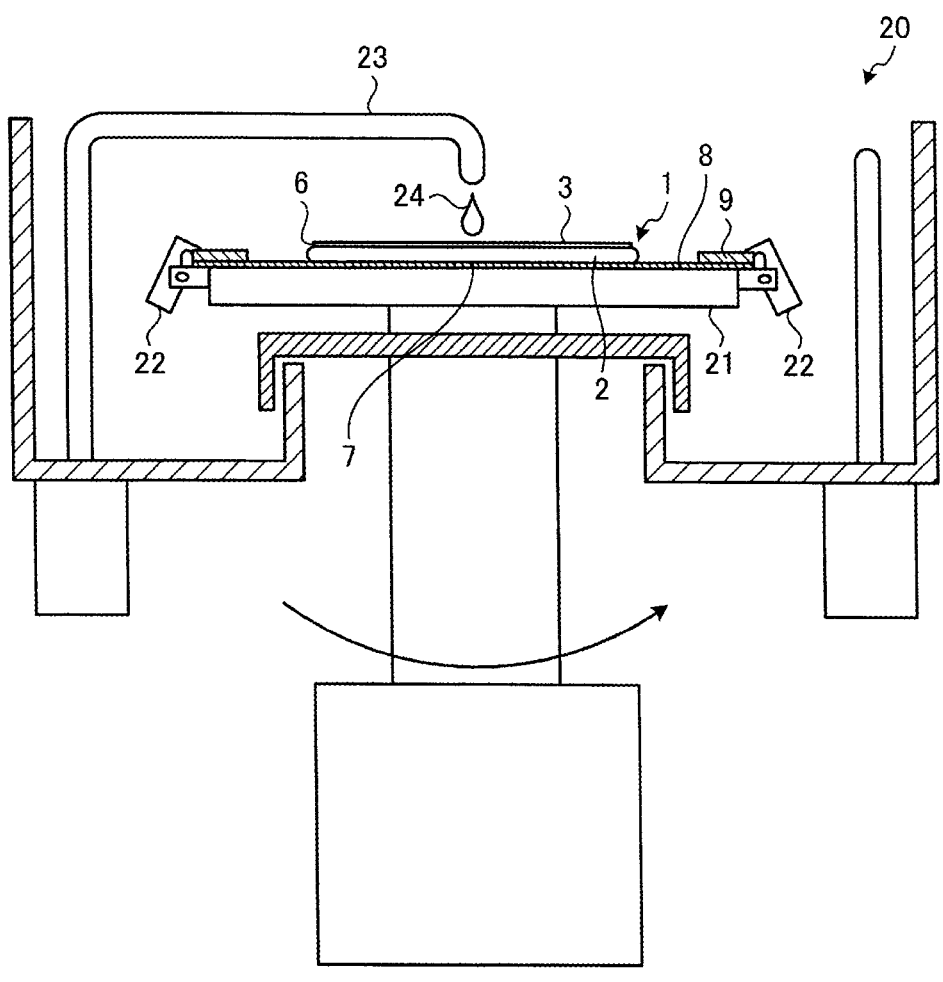
FIG. 4 is a schematic cross-sectional side view illustrating a protective film coating step of the processing method illustrated in FIG. 3.
Figure 5:
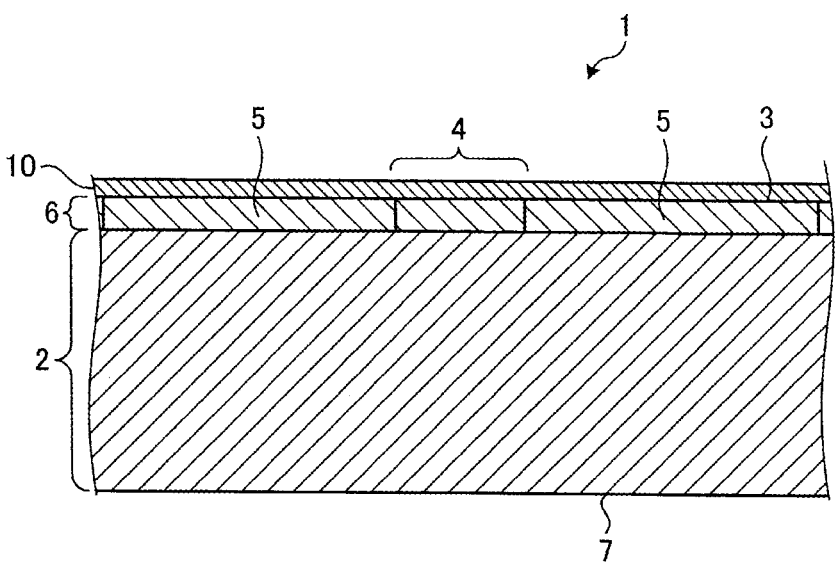
FIG. 5 is a cross sectional view of the main parts of the device wafer that has undergone the protective film coating step of the processing method illustrated in FIG. 3.

FIG. 4 is a schematic cross-sectional side view illustrating the protective film coating step of the processing method illustrated in FIG. 3. FIG. 5 is a cross sectional view of main parts of the device wafer that has undergone the protective film coating step of the processing method illustrated in FIG. 3. The protective film coating step 101 is a step of coating the face side 3 of the device wafer 1 with a protective film 10 (illustrated in FIG. 5) by a resin coating apparatus 20 illustrated in FIG. 4.

In the protective film coating step 101 of the first embodiment, as illustrated in FIG. 4, a circular plate-shaped tape 8 larger in diameter than the device wafer 1 is affixed to a reverse side 7 that is on the reverse side of the face side 3 of the device wafer 1, an annular frame 9 is affixed to an outer edge of the tape 8, and the device wafer 1 is supported in an inner opening of the annular frame 9. In the protective film coating step 101, as illustrated in FIG. 4, the resin coating apparatus 20 holds under suction the reverse side 7 of the device wafer 1 by a holding surface of a spinner table 21 and clamps the annular frame 9 by clamps 22 provided around the spinner table 21.

In the protective film coating step 101, as illustrated in FIG. 4, the resin coating apparatus 20 causes the spinner table 21 to rotate about its axis, and drops water-soluble resin 24 in liquid form from a water-soluble resin supply nozzle 23 to the center of the face side 3 of the device wafer 1. The dropped water-soluble resin 24 flows toward the outer circumferential side from the central side on the face side 3 of the device wafer 1 by the centrifugal force generated by rotation of the spinner table 21, and is thus applied over the entire face side 3 of the device wafer 1.

Note that the water-soluble resin 24 includes, for example, water-soluble resin such as polyvinyl alcohol (PVA) or polyvinylpyrrolidone (PVP). In the protective film coating step 101, the water-soluble resin 24 applied over the entire face side 3 of the device wafer 1 is dried, so that, as illustrated in FIG. 5, the entire face side 3 of the device wafer 1 is coated with the protective film 10 including the water-soluble resin 24. As described above, in the first embodiment, the protective film 10 includes the water-soluble resin 24.

Laser Processing Step

Figure 6:
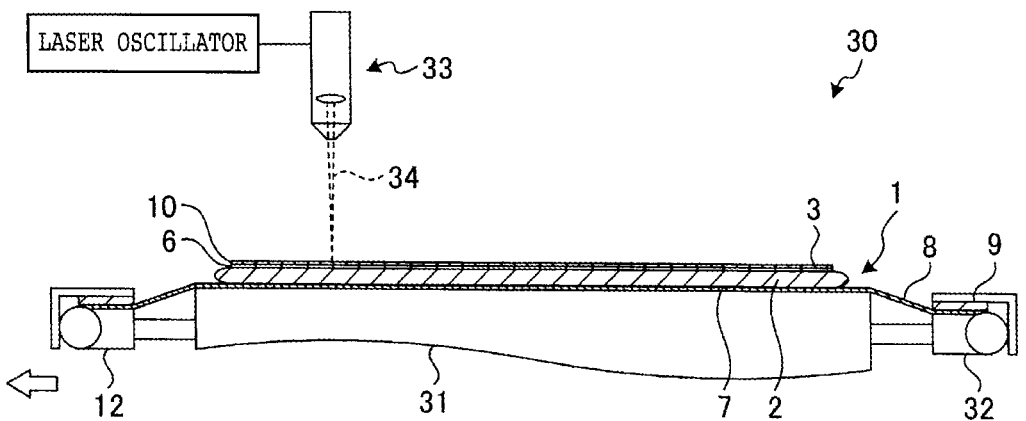
FIG. 6 is a schematic cross-sectional side view illustrating a laser processing step of the processing method illustrated in FIG. 3.
Figure 7:
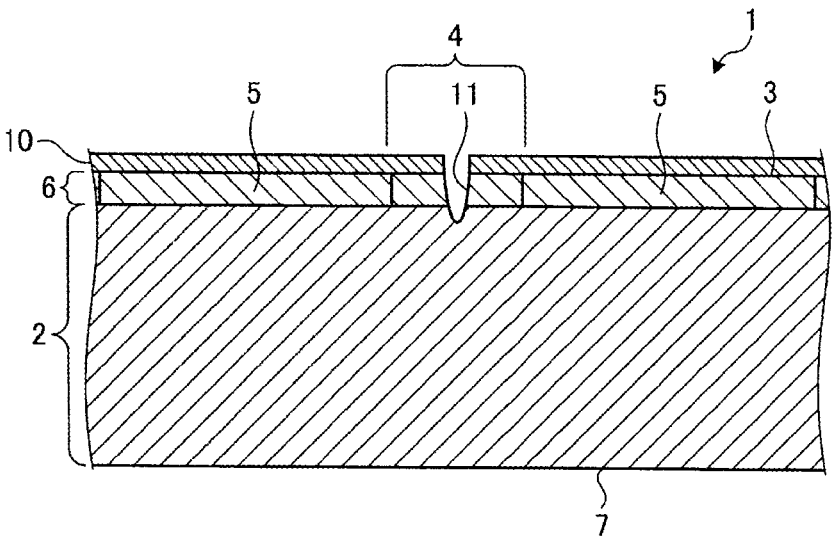
FIG. 7 is a cross sectional view of the main parts of the device wafer that has undergone the laser processing step of the processing method illustrated in FIG. 3.

FIG. 6 is a schematic cross-sectional side view illustrating a laser processing step of the processing method illustrated in FIG. 3. FIG. 7 is a cross sectional view of the main parts of the device wafer that has undergone the laser processing step of the processing method illustrated in FIG. 3. The laser processing step 102 is a step of forming laser processing grooves 11 (illustrated in FIG. 7) that divide the device layer 6, by applying, along the streets 4, a laser beam 34 (illustrated in FIG. 6) having a wavelength absorbable by the device wafer 1, after the protective film coating step 101 is carried out.

In the laser processing step 102 of the first embodiment, a laser processing apparatus 30 holds under suction the reverse side 7 of the device wafer 1 via the tape 8 by a holding surface of a holding table 31 and also clamps the annular frame 9 by clamps 32 provided around the holding table 31. In the laser processing step 102 of the first embodiment, the laser processing apparatus 30 images the face side 3 of the device wafer 1 by an unillustrated imaging unit, detects the streets 4, and performs alignment to align a laser beam application unit 33 and the streets 4.

In the laser processing step 102 of the first embodiment, the laser processing apparatus 30 applies, along the streets 4, the laser beam 34 having a wavelength absorbable by the device wafer 1 to the device wafer 1 from the laser beam application unit 33, as illustrated in FIG. 6, while moving the device wafer 1 and the laser beam application unit 33 relative to each other along the streets 4. Note that, in the laser processing step 102 of the first embodiment, the laser processing apparatus 30 sets the focal point of the laser beam 34 on a face side of the protective film 10 and applies the laser beam 34 to the device wafer 1 along the streets 4.

In the laser processing step 102 of the first embodiment, the laser processing apparatus 30 applies ablation processing to the protective film 10 and the device layer 6 on the streets 4 to remove part of them, and forms the laser processing grooves 11 that divide the device layer 6, in the streets 4, as illustrated in FIG. 7.

Note that, in the first embodiment, the protective film coating step 101 and the laser processing step 102 are carried out with the device wafer 1 supported by the annular frame 9 via the tape 8. However, in the present invention, the protective film coating step 101 and the laser processing step 102 may be performed without the tape 8 being affixed to the device wafer 1 and the device wafer 1 being supported by the annular frame 9.

Tape Affixing Step

Figure 8:
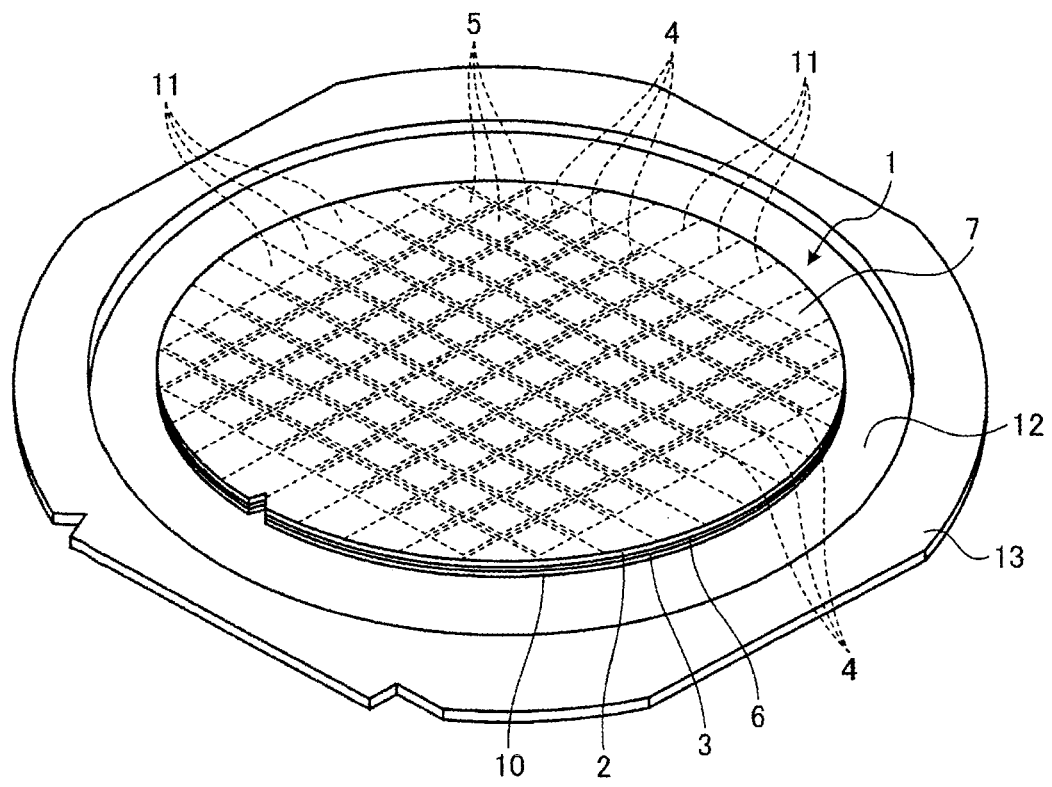
FIG. 8 is a perspective view schematically illustrating the device wafer that has undergone a tape affixing step of the processing method illustrated in FIG. 3.
Figure 9:
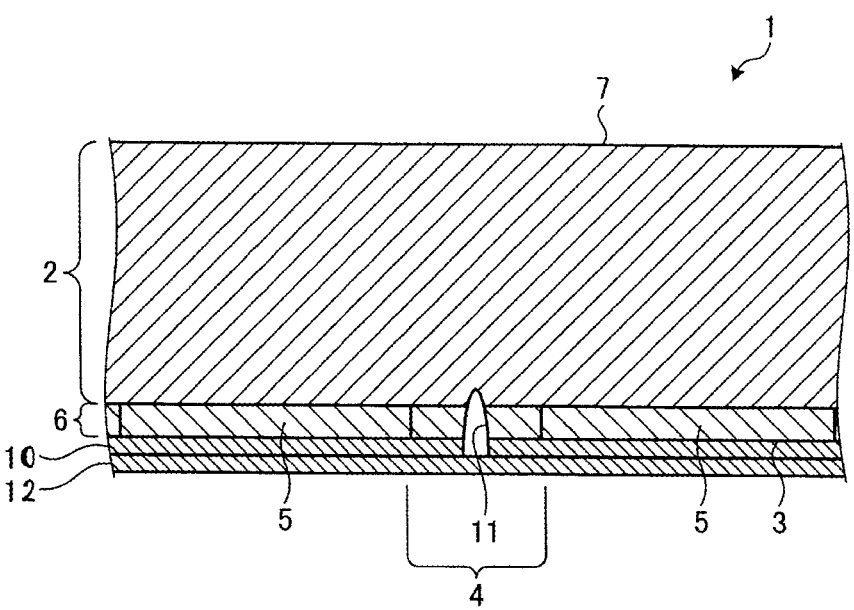
FIG. 9 is a cross sectional view of the main parts of the device wafer that has undergone the tape affixing step of the processing method illustrated in FIG. 3.

FIG. 8 is a perspective view schematically illustrating the device wafer that has undergone a tape affixing step of the processing method illustrated in FIG. 3. FIG. 9 is a cross sectional view of the main parts of the device wafer that has undergone the tape affixing step of the processing method illustrated in FIG. 3. The tape affixing step 103 is a step of affixing a tape 12 to the protective film 10 on the device wafer 1, after the laser processing step 102 is carried out.

In the tape affixing step 103 of the first embodiment, as illustrated in FIGS. 8 and 9, the tape 12 that has a circular plate shape and is larger in diameter than the device wafer 1 is affixed to the protective film 10 that covers the entire face side 3 of the device wafer 1, an annular frame 13 is affixed to an outer edge of the tape 12, and the device wafer 1 is supported in the inner opening of the annular frame 13. In the tape affixing step 103 of the first embodiment, the tape 8 is peeled off from the reverse side 7 of the device wafer 1, and the annular frame 9 is removed from the device wafer 1.

Note that, in the tape affixing step 103 of the first embodiment, the device wafer 1 is supported by the annular frame 13 via the tape 12. However, in the present embodiment, a tape 12 of the same diameter as the device wafer 1 may be affixed to the face side 3 of the device wafer 1. Specifically, the device wafer 1 need not be supported by the annular frame 13.

Holding Step

Figure 10:
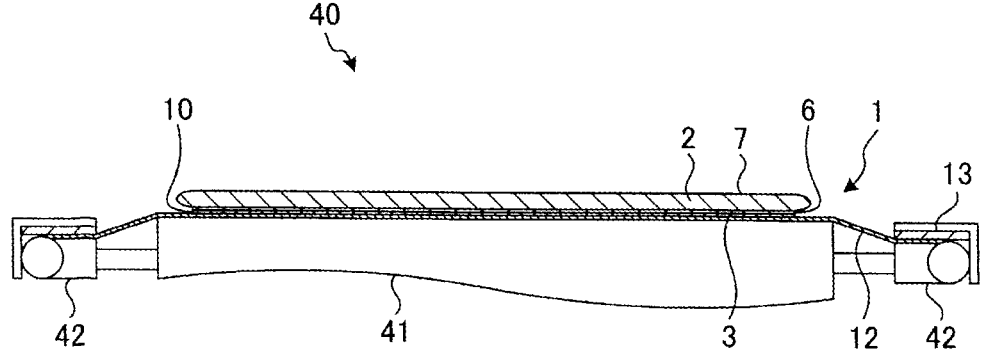
FIG. 10 is a schematic cross-sectional side view illustrating a holding step of the processing method illustrated in FIG. 3.

FIG. 10 is a schematic cross-sectional side view illustrating a holding step of the processing method illustrated in FIG. 3. The holding step 104 is a step of holding the face side 3 of the device wafer 1 via the tape 12 by a holding table 41 of a cutting apparatus 40 illustrated in FIG. 10 and exposing the reverse side 7, after the tape affixing step 103 is carried out. In the holding step 104 of the first embodiment, the cutting apparatus 40 holds under suction the face side 3 of the device wafer 1 by a holding surface of the holding table 41 via the tape 12, and exposes the reverse side 7 upward by clamping the annular frame 13 by clamps 42 provided around the holding table 41, as illustrated in FIG. 10.

Cutting Step

Figure 11:
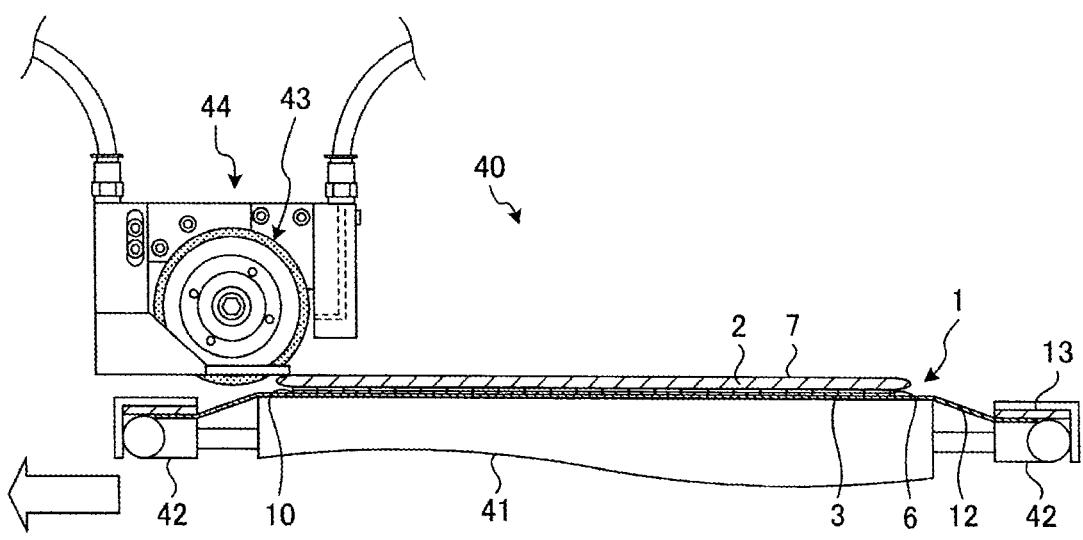
FIG. 11 is a schematic cross-sectional side view illustrating a cutting step of the processing method illustrated in FIG. 3.
Figure 12:
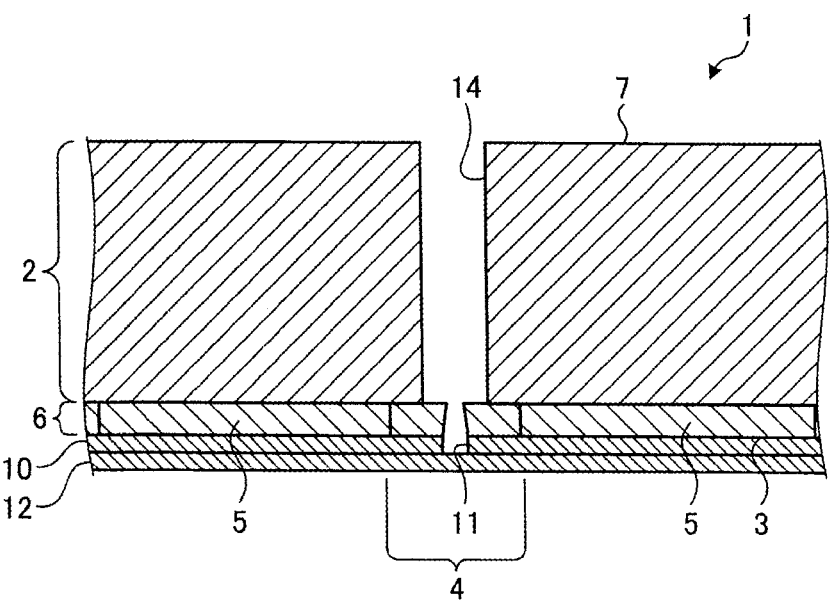
FIG. 12 is a cross sectional view of the main parts of the device wafer that has undergone the cutting step of the processing method illustrated in FIG. 3.

FIG. 11 is a schematic cross-sectional side view illustrating a cutting step of the processing method illustrated in FIG. 3. FIG. 12 is a cross sectional view of the main parts of the device wafer that has undergone the cutting step of the processing method illustrated in FIG. 3. The cutting step 105 is a step of cutting the device wafer 1 held on the holding table 41, by a cutting blade 43 from the reverse side 7, along the streets 4, and dividing the device wafer 1 into individual devices 5, after the holding step 104 is carried out.

In the cutting step 105 of the first embodiment, the cutting apparatus 40 images the reverse side 7 of the device wafer 1 by an unillustrated infrared imaging unit, detects the streets 4, and performs alignment to align the cutting blade 43 and the device wafer 1. In the cutting step 105 of the first embodiment, the cutting apparatus 40 causes the cutting blade 43 to cut into the streets 4 while moving the device wafer 1 and a cutting unit 44 relative to each other along the streets 4, as illustrated FIG. 11.

Note that, in the cutting step 105 of the first embodiment, the cutting apparatus 40 causes the cutting blade 43 to cut into the streets 4 from the reverse side 7 to a depth where a lower end of a cutting edge of cutting blade 43 reaches the laser processing grooves 11. Further, in the cutting step 105 of the first embodiment, the cutting apparatus 40 causes the cutting blade 43 to cut into the device wafer 1 from the reverse side 7 to a depth where the lower end of the cutting edge of the cutting blade 43 reaches an interface between the device layer 6 and the substrate 2.

In the cutting step 105, the cutting apparatus 40 performs cutting processing on all the streets 4 of the device wafer 1 held by the holding table 41 and forms, in the streets 4, cutting grooves 14 that communicate with the laser processing grooves 11 as illustrated FIG. 12. In such a manner, in the cutting step 105 of the first embodiment, the cutting grooves 14 that communicate with the laser processing grooves 11 are formed in the streets 4, and the device wafer 1 is divided into individual devices 5.

As described above, in the device wafer processing method according to the first embodiment, after the protective film 10 is formed on the face side 3 of the device wafer 1 in the protective film coating step 101, the laser beam 34 is applied to the face side 3 of the device wafer 1 to divide the device layer 6 in the laser processing step 102. Next, in the device wafer processing method according to the first embodiment, the tape 12 is affixed to the protective film 10 in the tape affixing step 103, and the device wafer 1 is cut by the cutting blade 43 from the reverse side 7 of the device wafer 1 and divided into individual devices 5 in the cutting step 105.

In the device wafer processing method according to the first embodiment, at the time when the laser beam 34 is to be applied from the face side 3 of the device wafer 1 in the laser processing step 102, the devices 5 are protected by the protective film 10, so that foreign matter does not adhere to the face side 3 of the device wafer 1. Moreover, in the device wafer processing method according to the first embodiment, the device wafer 1 is divided by the cutting blade 43 from the reverse side 7 in the cutting step 105, so that foreign matter does not adhere to the face side 3 of the device wafer 1. Moreover, occurrence of chipping or cracking on the face side 3 is reduced, preventing the processing quality on the face side 3 from deteriorating.

Further, in the device wafer processing method according to the first embodiment, at the time when the device wafer 1 is to be cut by the cutting blade 43 from the reverse side 7 of the device wafer 1 in the cutting step 105, the tape 12 is affixed to the face side 3 of the device wafer 1 in a state in which the face side 3 is covered with the protective film 10, so that residues of the tape 12 do not remain on the face side 3 of the device wafer 1.

Accordingly, the device wafer processing method according to the first embodiment can reduce adherence of foreign matter to the face side 3 of the device wafer 1 without causing deterioration of the processing quality on the face side 3.

Moreover, the device wafer processing method according to the first embodiment forms the laser processing grooves 11 by applying the laser beam 34 from the face side 3 of the device wafer 1 in the laser processing step 102, so that the width of the streets 4 can be kept small compared to that of the device wafer whose streets 4 are cut from the face side 3. Therefore, the number of devices 5 to be formed on the substrate 2 can be increased compared to that in the device wafer whose streets 4 are cut from the face side 3.

Second Embodiment

Figure 14:
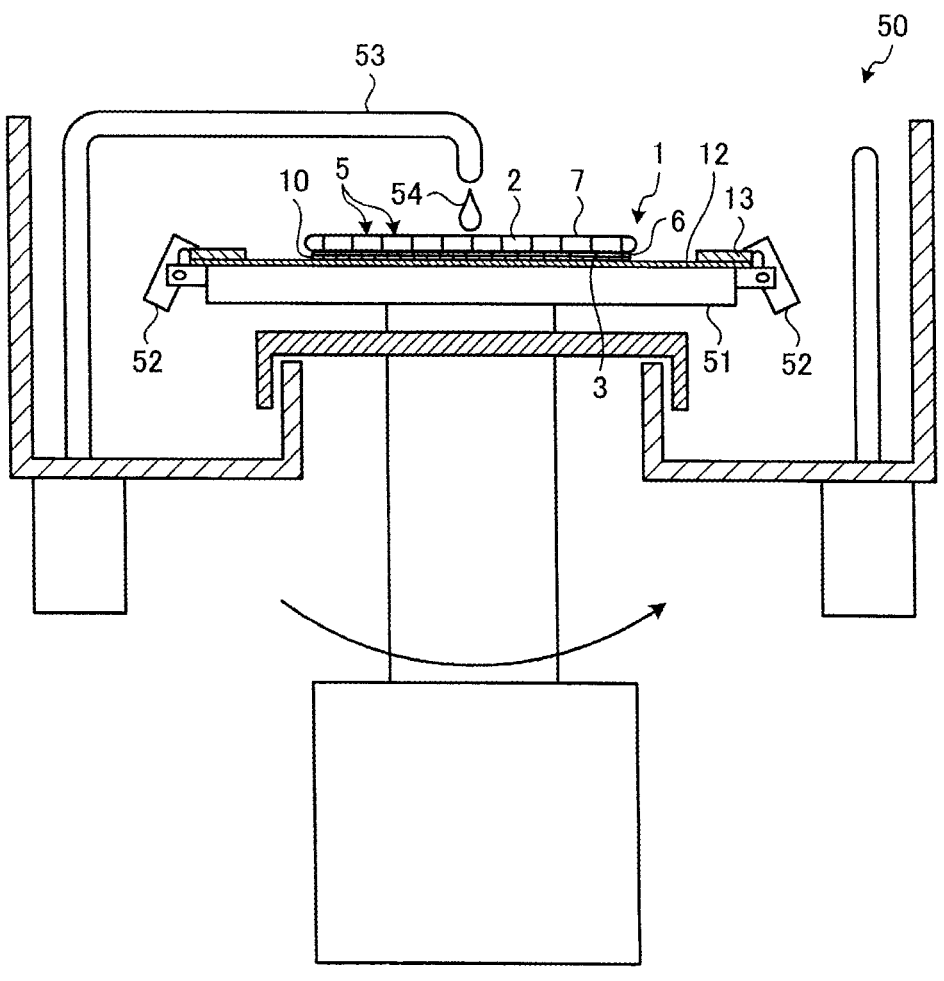
FIG. 14 is a schematic cross-sectional side view illustrating a reverse side cleaning step of the processing method illustrated in FIG. 13.
Figure 15:
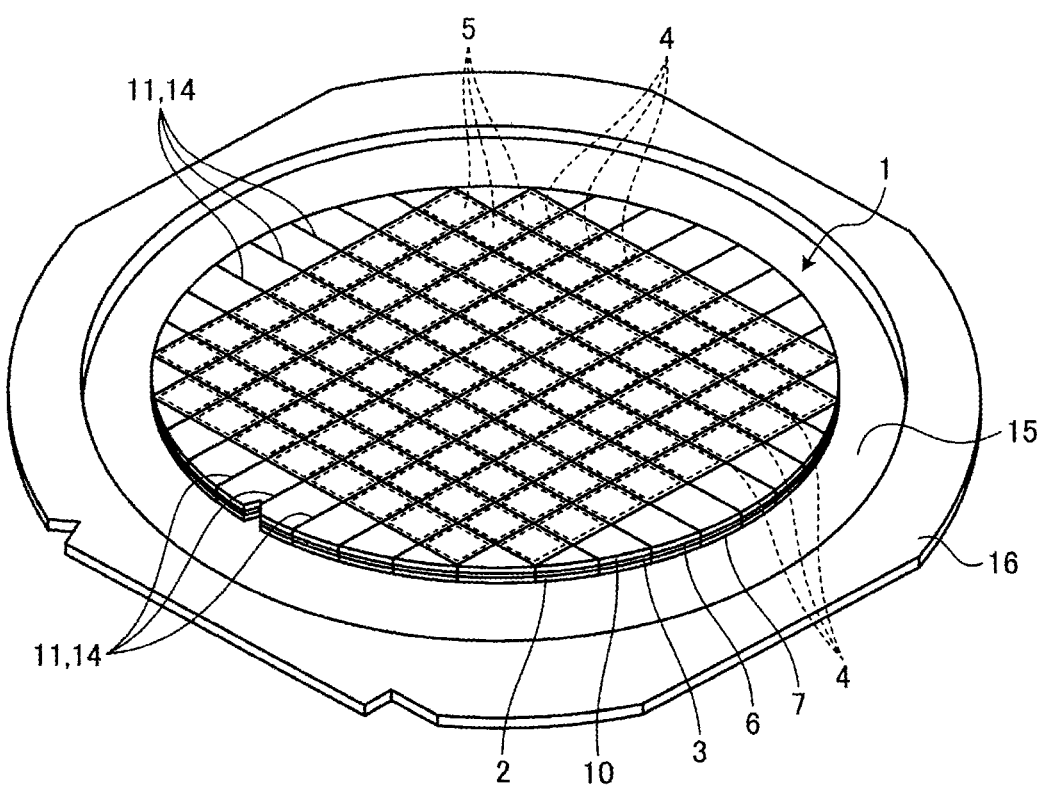
FIG. 15 is a perspective view schematically illustrating the device wafer that has undergone a transferring step of the processing method illustrated in FIG. 13.
Figure 16:
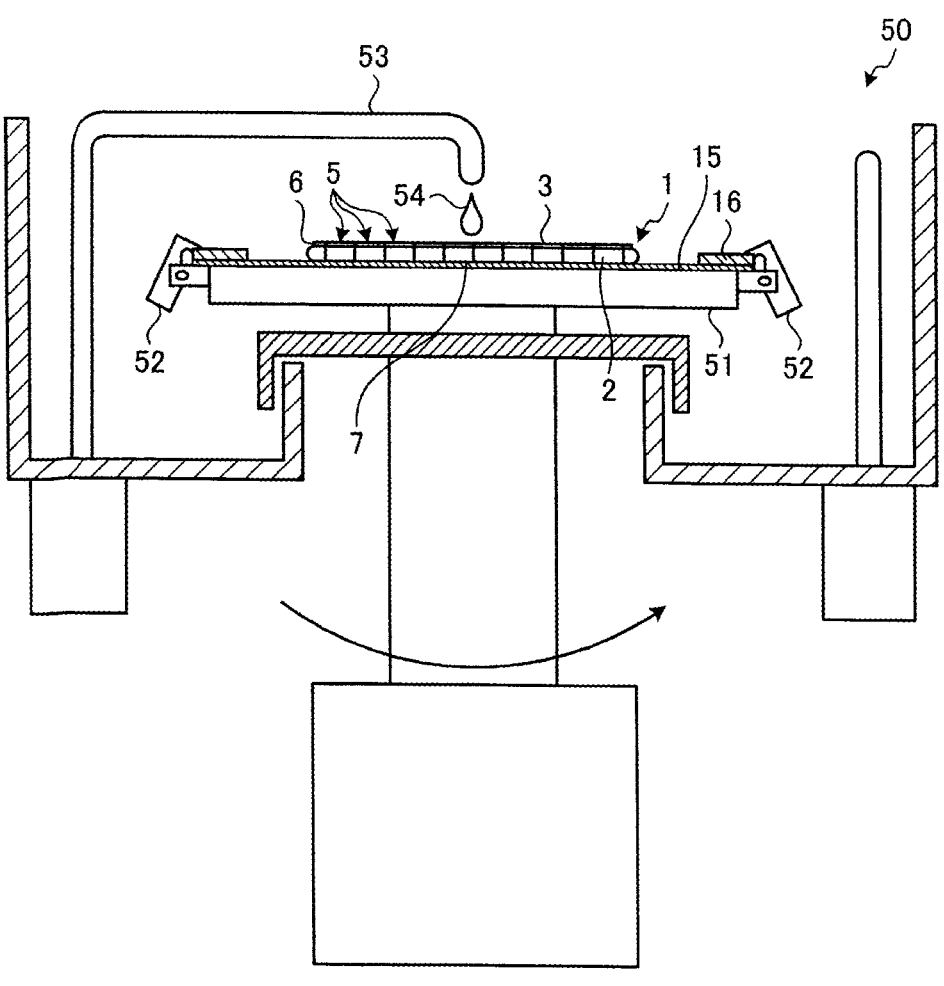
FIG. 16 is a schematic cross-sectional side view illustrating a protective film removing step of the processing method illustrated in FIG. 13.

The device wafer processing method according to a second embodiment of the present invention will be described with reference to the drawings. FIG. 13 is a flowchart illustrating a flow of the processing method according to the second embodiment. FIG. 14 is a schematic cross-sectional side view illustrating a reverse side cleaning step of the processing method illustrated in FIG. 13. FIG. 15 is a perspective view schematically illustrating the device wafer that has undergone a transferring step of the processing method illustrated in FIG. 13. FIG. 16 is a schematic cross-sectional side view illustrating a protective film removing step of the processing method illustrated in FIG. 13. Note that, in FIGS. 13, 14, 15, and 16, parts identical to those in the first embodiment are denoted by the same reference signs, and their descriptions will be omitted.

The device wafer processing method according to the second embodiment includes a reverse side cleaning step 106, a transferring step 107, and a protective film removing step 108, in addition to the protective film coating step 101, the laser processing step 102, the tape affixing step 103, the holding step 104, and the cutting step 105, as illustrated in FIG. 13.

The reverse side cleaning step 106 is a step of cleaning the reverse side 7 of the device wafer 1, after the cutting step 105 is carried out. In the reverse side cleaning step 106 of the second embodiment, a cleaning apparatus 50 holds under suction the face side 3 of the device wafer 1 by a holding surface of a spinner table 51 via the tape 12 and clamps the annular frame 13 by clamps 52 provided around the spinner table 51, as illustrated in FIG. 14.

In the reverse side cleaning step 106 of the second embodiment, the cleaning apparatus 50 supplies cleaning water (cleaning liquid) 54 including purified water from a cleaning water supply nozzle 53 to the center of the reverse side 7 of the device wafer 1, in a state in which the spinner table 51 is rotated about its axis, as illustrated in FIG. 14. The cleaning water 54 supplied to the reverse side 7 of the device wafer 1 flows toward the outer circumferential side from the central side on the reverse side 7 of the device wafer 1 by the centrifugal force generated by rotation of the spinner table 51 and cleans the reverse side 7 of the device wafer 1, thereby removing foreign matter such as cutting swarf from the reverse side 7 of the device wafer 1.

The transferring step 107 is a step of affixing a reverse side tape 15 to the cleaned reverse side 7 and peeling off the tape 12 from the face side 3 of the device wafer 1, after the reverse side cleaning step 106 is carried out. In the transferring step 107 of the second embodiment, as illustrated in FIG. 15, the reverse side tape 15 that has a circular plate shape and is larger in diameter than the device wafer 1 is affixed to the reverse side 7 of the device wafer 1, an annular frame 16 is affixed to an outer edge of the reverse side tape 15, the tape 12 is peeled off from the face side 3, and the device wafer 1 is supported in the inner opening of the annular frame 16.

The protective film removing step 108 is a step of removing the protective film 10 on the face side 3 of the device wafer 1, after the transferring step 107 is carried out. In the protective film removing step 108 of the second embodiment, the cleaning apparatus 50 holds under suction the reverse side 7 of the device wafer 1 by the holding surface of the spinner table 51 via the reverse side tape 15 and clamps the annular frame 16 by the clamps 52 provided around the spinner table 51, as illustrated in FIG. 16.

In the protective film removing step 108, the cleaning apparatus 50 supplies the cleaning water 54 including purified water from the cleaning water supply nozzle 53 to the center of the face side 3 of the device wafer 1, in a state in which the spinner table 51 is rotated about its axis, as illustrated in FIG. 16. The cleaning water 54 supplied to the face side 3 of the device wafer 1 flows toward the outer circumferential side from the central side on the face side 3 of the device wafer 1 by the centrifugal force generated by rotation of the spinner table 51 and cleans the face side 3 of the device wafer 1, thereby removing, from the face side 3 of the device wafer 1, the protective film 10 including the water-soluble resin 24, together with foreign matter such as debris.

The processing method according to the second embodiment first forms the protective film 10 on the face side 3 of the device wafer 1, and then applies the laser beam 34 to the face side 3 of the device wafer 1 to divide the device layer 6, affixes the tape 12 to the protective film 10, and cuts the device wafer 1 by the cutting blade 43 from the reverse side 7 of the device wafer 1 to divide the device wafer 1 into individual devices 5, so that, similarly to the first embodiment, the second embodiment can reduce adherence of foreign matter to the face side 3 of the device wafer 1 without deteriorating the processing quality on the face side 3.

Note that the present invention is not limited to the abovementioned embodiments. That is, the present invention can be implemented with various modifications applied thereto within the scope not departing from the gist thereof. For example, in the protective film coating step 101 of the present invention, a water-insoluble protective film may be formed as the protective film 10. Typically, the protective film 10 can be formed by a known resist agent configuring a mask to be used at the time of dry etching. In this case, a known resist peeling agent is used as the cleaning water (cleaning liquid) 54, and the protective film 10 is removed from the face side 3 of the device wafer 1, in the protective film removing step 108.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A device wafer processing method that divides a device wafer having devices formed on a face side thereof by a device layer laminated on a wafer, along a plurality of streets that demarcate the devices, the processing method comprising:

a protective film coating step of coating the face side of the device wafer with a protective film, wherein the protective film has a front surface and a back surface, the back surface being on the face side of the device wafer;

a laser processing step of applying, along the streets, a laser beam having a wavelength absorbable by the device wafer to the device wafer and forming laser processing grooves that divide the device layer, after the protective film coating step is carried out;

a tape affixing step of affixing a tape to the front surface of the protective film on the device wafer, after the laser processing step is carried out;

a holding step of holding the face side of the device wafer by a holding table via the tape and exposing a reverse side of the device wafer, after the tape affixing step is carried out; and a cutting step of cutting the device wafer held on the holding table, by a cutting blade from the reverse side along the streets, and dividing the device wafer into individual devices, after the holding step is carried out.

2. The device wafer processing method according to claim 1, further comprising:

a reverse side cleaning step of cleaning the reverse side of the device wafer, after the cutting step is carried out;

a transferring step of affixing a reverse side tape to the cleaned reverse side and peeling off the tape from the face side of the device wafer, after the reverse side cleaning step is carried out; and a protective film removing step of removing the protective film on the face side of the device wafer, after the transferring step is carried out.

3. The device wafer processing method according to claim 2, wherein the protective film is composed of water-soluble resin, and, in the protective film removing step, cleaning water is supplied to the face side of the device wafer to remove the protective film and clean the face side.

4. The device wafer processing method according to claim 1, wherein the protective film coating step includes applying a water soluble resin in liquid form to a center of the face side of the device wafer to form the protective film.

* * * * *